United States Patent
Person et al.

[11] Patent Number: 5,631,566
[45] Date of Patent: May 20, 1997

[54] RADIO SPEAKER SHORT CIRCUIT DETECTION SYSTEM

[75] Inventors: Andrew P. Person; James P. Muccioli, both of Farmington Hills, Mich.

[73] Assignee: Chrysler Corporation, Auburn Hills, Mich.

[21] Appl. No.: 699,184

[22] Filed: Aug. 16, 1996

Related U.S. Application Data

[63] Continuation of Ser. No. 155,720, Nov. 22, 1993, abandoned.

[51] Int. Cl.[6] ................................................. G01R 27/26
[52] U.S. Cl. ............................. 324/556; 381/59; 340/650
[58] Field of Search ...................................... 324/555, 556, 324/537; 340/438, 649, 650; 381/86, 59, 55, 52, 57

[56] References Cited

U.S. PATENT DOCUMENTS

| | | | |
|---|---|---|---|
| 4,565,991 | 1/1986 | Lupoli et al. | 340/438 |
| 4,862,142 | 8/1989 | Knight | 340/650 |
| 4,887,298 | 12/1989 | Haigler | 381/59 |
| 4,910,494 | 3/1990 | Tamai | 340/438 |
| 5,345,510 | 9/1994 | Singhi et al. | 381/77 |
| 5,361,305 | 11/1994 | Easley et al. | 381/59 |

FOREIGN PATENT DOCUMENTS

| | | | |
|---|---|---|---|
| 403079445 | 4/1991 | Japan | 340/438 |
| 404043137 | 2/1992 | Japan | 340/438 |

*Primary Examiner*—Maura K. Regan
*Attorney, Agent, or Firm*—Roland A. Fuller, III

[57] ABSTRACT

A radio speaker short circuit detection system for a vehicle visually indicates a speaker short circuit failure. A microprocessor receives a short circuit failure signal from a short circuit detection circuit. Short circuit failure data can be stored for future diagnostic retrieval.

3 Claims, 1 Drawing Sheet

RADIO SPEAKER SHORT CIRCUIT DETECTION SYSTEM

This application is a continuation of application Ser. No. 08/155,720 filed Nov. 22, 1993 now abandoned.

BACKGROUND OF THE INVENTION

1. Field of the Invention

The present invention relates to automotive audio short circuit detection and protection. More particularly, the invention relates to a short circuit detection system that provides visual indication of short circuit failure and stores the failure information for future retrieval.

BACKGROUND ART

Automotive audio power amplifier integrated circuits (ICs) have implemented short circuit protection by many methods. These protection methods result in "NO AUDIO" from the radio. Consequently, the customer or the dealer doesn't know if the radio is defective, the wiring harness is open or shorted, or the loudspeaker is open, shorted, or blown. Since of the components of a sound system the radio is the easiest to replace, the dealer typically starts to troubleshoot the sound system by replacing the radio, resulting in many radio warranty claims for removing or replacing a good radio for which no trouble is found.

The present invention will eliminate these "NO TROUBLE FOUND" radio warranty claims by indicating detected speaker error with a displaying of a "SP Err" indication on the radio display when short circuit is detected. The short circuit failure information is stored in EEPROM (electronically erasable programmable read only memory). The customer receives a visual indication that the loss of audio is not a radio failure but due to harness or speaker short circuits.

SUMMARY OF THE INVENTION

The present invention provides visual indication of speaker short circuit failure by means of messages sent from the vehicle's microprocessor to an indication means.

Thus, according to one aspect of the present invention, a circuit is described for visually indicating speaker short circuit failure in an automotive vehicle.

According to another aspect of the present invention, a circuit is described that provides future retrieval of stored speaker short circuit failure data in a vehicle with a multiplex bus system.

According to yet another aspect of the present invention, a method for visually indicating speaker short circuit failure in an automotive vehicle is disclosed, comprising the steps of detecting short circuit failure, sending a first short circuit failure signal to a microprocessor, and sending a second failure signal to a display screen.

BRIEF DESCRIPTION OF THE DRAWINGS

Other objects, features and advantages of the present invention will become more fully apparent from the following detailed description of the preferred embodiment, the appended claims and in the accompanying drawings in which:

DETAILED DESCRIPTION OF THE PREFERRED EMBODIMENTS

Figure 1:
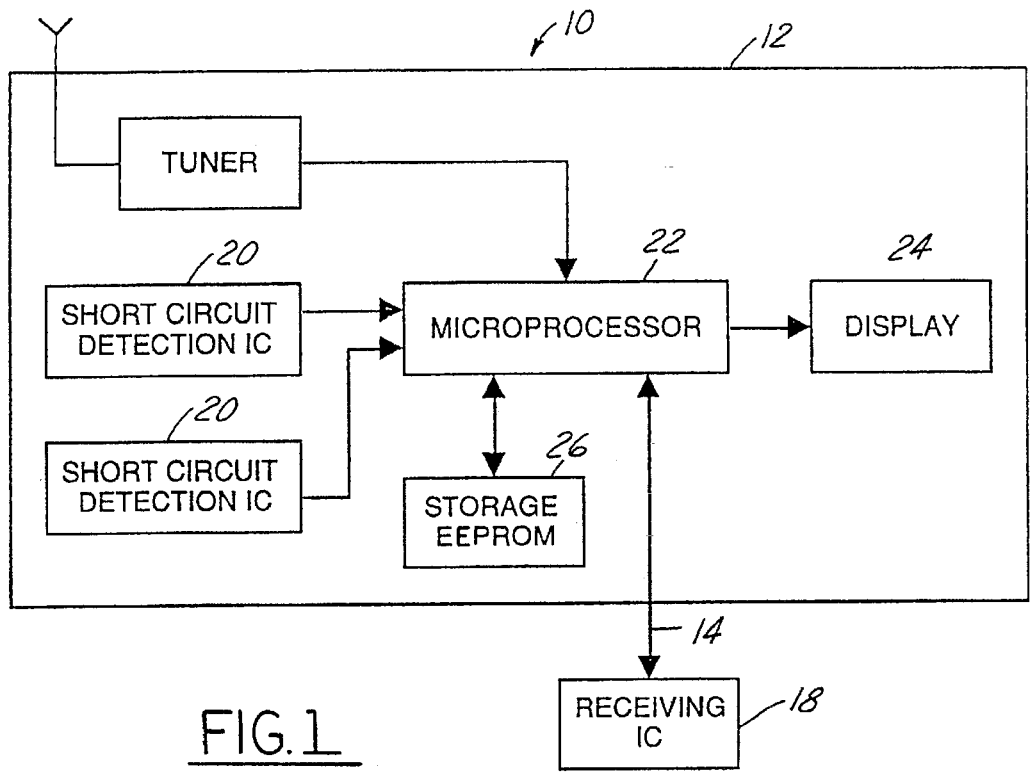
FIG. 1 is a block diagram of the short circuit detection system made in accordance with the teachings of the preferred embodiment of this invention.

Referring now to the drawings, FIG. 1 depicts a radio speaker short circuit detection system 10 made in accordance with the teachings of the preferred embodiment of this invention. As shown, circuit detection system 10 includes an automotive radio 12, coupled by a vehicle multiplex bus 14 to a receiving means 18.

The automotive radio 12 includes a short circuit detection circuit 20 for each left audio channel and right audio channel. A detection circuit 20 is able to detect a short circuit condition on the output of either the right audio channel or the left audio channel. The detection circuit 20 can be one of a number of commercially available circuits. When the detection circuit 20 detects a short circuit in a speaker it sends a short circuit signal to a microprocessor 22. The microprocessor 22 receives the short circuit signal and thereafter generates a corresponding error signal. A display 24 receives the error signal and responds by visually indicating a short circuit failure to the user.

The display 24 can be a vacuum-fluorescent display or a liquid crystal display. Accordingly, the display 24 visually notifies the user that the "NO AUDIO" problem is not due to a failure of the radio, but of the speaker or wiring harness. This information can be continuously displayed to the user. Alternatively, it can be displayed for a predetermined period of time and then stopped and again displayed upon ignition reset.

In addition, a storage circuit 26 is provided to store the short circuit signal sent to microprocessor 24 for retrieval at a later time. The storage circuit 26 can be in the form of an electrically erasable programmable read only memory (EEPROM) IC. Retrieval of the stored short circuit signal can be accomplished by coupling a receiving tool 18 to multiplex bus 14. The receiving tool 18 can be an interface tool that allows a user to access multiplex bus 14 and send predetermined formatted messages to the storage circuit 26 via the microprocessor 24 which seeks stored short circuit signal data.

Figure 2:
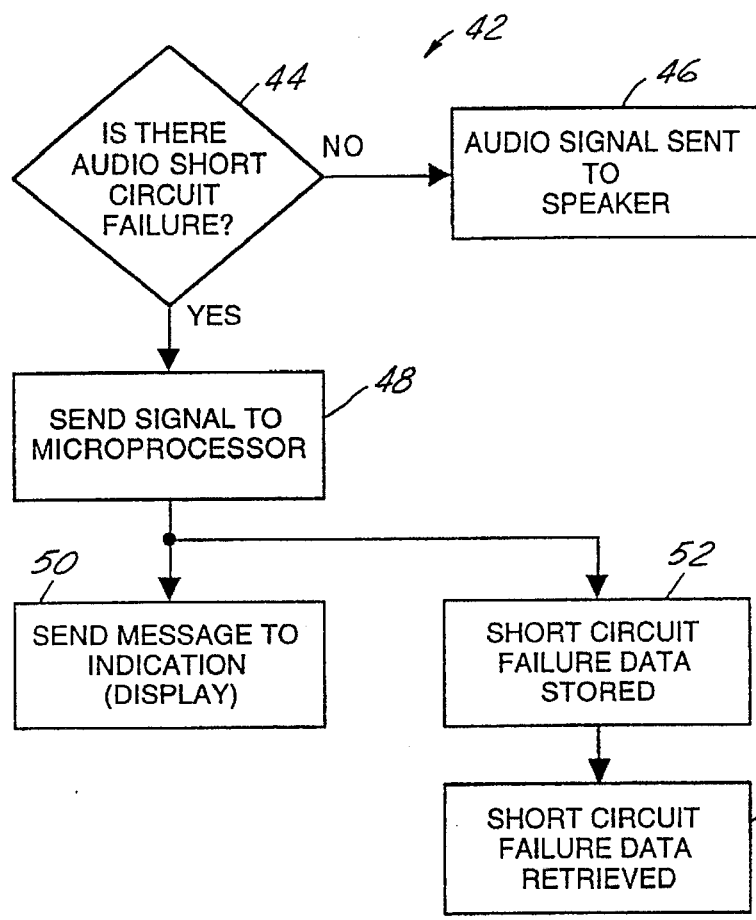
FIG. 2 is a flowchart illustrating the general sequence of steps associated with the operation of the system shown in FIG. 1.

Referring now to flowchart 42 of FIG. 2, there is shown a general sequence of steps associated with the use of the radio speaker short circuit detection system 10. An initial step 44 involves determining if there is an audio short circuit failure. If there is no short circuit failure, step 46 illustrates that an audio signal is sent to a loudspeaker and emits audio sound.

If there is a short circuit failure, step 44 is followed by step 48 in which short circuit detection circuit 20 sends the appropriate signal to the microprocessor 22. The microprocessor 22 then sends an error message to the display 24 as illustrated by step 50. In addition, the microprocessor 22 stores this short circuit failure information into the storage circuit 26 as shown in step 52. The stored short circuit failure data is retrieved by a receiving tool 18, as shown in step 54.

While the present invention has been disclosed with the preferred embodiment thereof, it should be understood that there may be other embodiments which fall within the spirit and scope of the invention and that the invention is susceptible to modification, variation and change without departing from the proper scope or fair meaning of the following claims.

What is claimed is:

1. A short circuit detection system for indicating speaker short circuit failure in a vehicle radio including a memory unit, said system comprising:

a short circuit detector for detecting speaker short circuit failure and generating a short circuit signal in response to said detected short circuit failure;

a microprocessor coupled to said short circuit detector for receiving said short circuit signal and generating an error signal thereafter and to said vehicle radio memory unit for storing said short circuit signal;

a receiver adapted to be connected to said microprocessor by a user via a multiplex bus, to retrieve said stored short circuit signal from said memory unit and direct the same to said microprocessor; and a display unit adapted to be coupled to said microprocessor for receiving said error signal generated in said microprocessor in response to said short circuit signal and indicating short circuit failure in response to said error signal, wherein said short circuit signal can be retrived from said memory unit irrespective of said radio being in said vehicle.

2. A method for informing a service person of speaker short circuit failure of a radio system in a vehicle, said system including a storage means, said method comprising the steps of:

A) detecting speaker or harness short circuit failure;

B) generating a short circuit signal in response to said detecting;

C) storing said short circuit signal in said radio system storage means;

D) retrieving said stored short circuit signal in response to a request of said .service person;

E) generating an error signal in response to said short circuit signal; and

F) indicating said error signal, to thereby expose said failure to said person servicing said system after it has been taken out of said vehicle.

3. A short circuit detection system for indicating speaker short circuit failure of a radio in a vehicle, said detection system being incorporated in said vehicle radio and comprising:

a short circuit detector for detecting speaker short circuit failure and generating a short circuit signal in response to said detected short circuit failure;

a microprocessor coupled to said short circuit detector for receiving said short circuit signal and generating an error signal thereafter; and a memory unit coupled to said microprocessor for storing said short circuit signal;

said microprocessor being adapted to be accessed by a user via a multiplex bus, to retrieve said short circuit signal stored in said vehicle radio from said memory unit and direct the same back to said microprocessor, whereby said error signal can be displayed at later tests of said radio disassembled from said vehicle to indicate said short circuit failure.

* * * * *